United States Patent [19]

Klein et al.

[11] Patent Number: 4,763,403
[45] Date of Patent: Aug. 16, 1988

[54] METHOD OF MAKING AN ELECTRONIC COMPONENT

[75] Inventors: Gerald W. Klein, Pittsford; Dennis R. Zander, Penfield, both of N.Y.

[73] Assignee: Eastman Kodak Company, Rochester, N.Y.

[21] Appl. No.: 942,122

[22] Filed: Dec. 16, 1986

[51] Int. Cl.⁴ .................. H02K 15/04; H05K 3/36
[52] U.S. Cl. .......................... 29/598; 29/830; 29/852; 264/61; 310/268
[58] Field of Search .............. 29/598, 596, 830, 852; 264/61; 310/268

[56] References Cited

U.S. PATENT DOCUMENTS

| 3,953,924 | 5/1976 | Zachry et al. | 29/625 |
| 4,109,377 | 8/1978 | Blazick et al. | 29/626 |
| 4,322,490 | 3/1982 | Molaire | 430/281 |
| 4,340,833 | 7/1982 | Sudo et al. | 310/268 |
| 4,342,151 | 8/1982 | Guild | 29/827 |
| 4,417,393 | 11/1983 | Becker | 29/846 |
| 4,437,109 | 3/1984 | Anthony et al. | 357/68 |
| 4,521,449 | 6/1985 | Arnold et al. | 29/852 X |

FOREIGN PATENT DOCUMENTS 0013436 4/1980 Japan .......................... 29/852

Primary Examiner—Carl E. Hall
Attorney, Agent, or Firm—Donald D. Schaper

[57] ABSTRACT

A method for making an electronic component, for example, a motor coil. The method comprises the steps of forming a plurality of conductive layers and interconnecting the layers to provide an electrically conductive path between the layers. In order to form interconnections between the layers which have a low electrical resistance and which can be formed in a high-speed automated process, a conductive paste is applied to one of the conductive layers and the layers are superposed to form the interconnections.

10 Claims, 4 Drawing Sheets

METHOD OF MAKING AN ELECTRONIC COMPONENT

FIELD OF THE INVENTION

The present invention relates to a method of making an electronic component. More particularly, the invention relates to a method of forming an electronic component having a plurality of conductive layers in which certain of the layers are interconnected.

DESCRIPTION OF PRIOR ART

Compact, inexpensive electronic actuators, such as DC motors, are employed in a wide variety of consumer products. In many such applications, a thin flat actuator is used in order to conserve space. It is known to form these actuators by printed circuit techniques in which copper layers, formed on a dielectric material, are etched to produce a desired configuration such as a coil. A component for an actuator of this type is disclosed in U.S. Pat. No. 4,340,833.

U.S. Pat. No. 4,340,833, discloses an armature for a miniature motor in which spiral coils are arranged on opposite sides of an insulating sheet. The coils in the armature are connected in series and the inner ends of opposing coils are connected to each other through the insulating sheet. The connections of the inner ends of the coils are made by spot welding. One problem with connecting the coils in this manner is that only two layers of conductive material can be connected at a time. Further, it has been found that such welded connections have a relatively high resistance which limits the amount of current which can be put through the connections. Thus, the coils with welded connections are not suitable for use in high-torque motors.

It is known in the preparation of multilayer ceramic devices for receiving semiconductor chips to use a conductive paste to from an entire electrical circuit including interconnections between the ceramic layer. It is also known to form interconnections between conductive sheets in a multilayer circuit pattern by a process in which a mask is used to form a pattern of raised conductors on each conductive sheet; one conductive sheet is then placed over another such that the raised connectors on one sheet can be joined to the raised conductors on another sheet by a suitable metallurgical joining process. Neither of these known methods, however, is suitable for forming interconnections between the conductive metallic layers of an electronic component in a high-speed automated process.

SUMMARY OF THE INVENTION

It is an object of the present invention to overcome the problems in the prior art noted above and to provide an improved method of making an electronic component.

In accordance with one aspect of the invention, there is provided a method of making an electronic component, the method comprising the steps of forming a first element having a first conductor pattern, forming a second element having a second conductor pattern, applying a pliable conductive paste to a selected portion of one of the conductor patterns, and positioning the elements adjacent each other such that the paste is shaped by the elements and the elements and the conductor patterns are electrically connected.

It is a further aspect of the present invention to provide a method of making an electronic component comprising the steps of: exposing a blank having a copper layer, a positive resist on one side, and a negative resist on an opposite side; developing the positive resist; etching the copper to form a conductor pattern; stripping the positive resist; developing the negative resist to form a first laminate comprising a conductor pattern on a dielectric substrate having openings which extend to the conductor pattern; forming a second laminate generally similar to the first laminate; dispensing a conductive paste into the openings of one of the laminates; superposing the laminates such that the conductive paste electrically connects the conductive patterns; and curing the superposed laminates under heat and pressure.

One advantage of the present invention is that many interconnections can be made between two conductive layers by simply placing one layer over the other layer and bonding the layers together. This method is much faster than a process of welding each of the connections. Further, in the present method of forming interconnections, it is possible to simultaneously form interconnections between more than two layers. The use of the conductive paste to form the interconnections between conductor layers results in strong permanent interconnections having a relatively low electrical resistance.

Other features and advantages will become apparent from reference to the following Description of the Preferred Embodiment when read in light of the attached drawings.

DESCRIPTION OF THE PREFERRED EMBODIMENT

Figure 1:
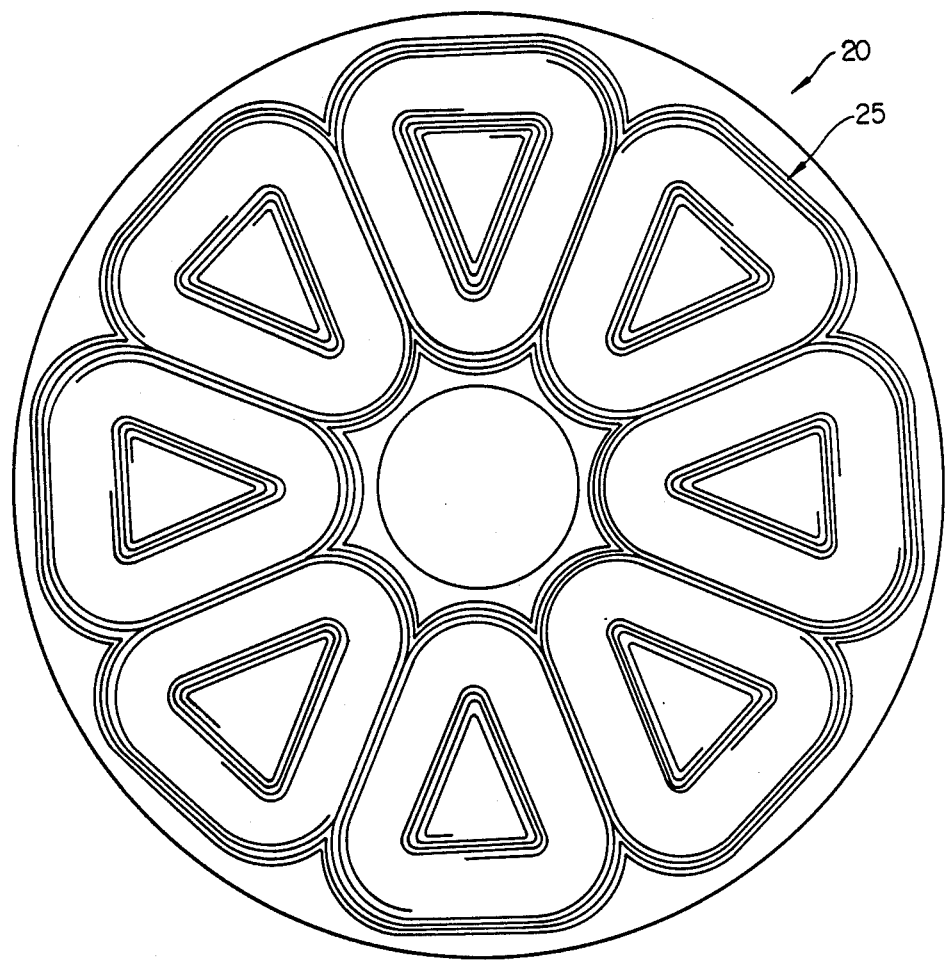
FIG. 1 is a top plan view of an electronic component produced in accordance with the present invention.

With reference to FIG. 1, there is shown an electronic component in the form of a motor coil 20 which has been made according to the method of the present invention. It will be understood that other electronic components can be made according to the present invention, for example, an electromagnetic actuator for use in driving a shutter blade in a photographic camera.

Figure 2:
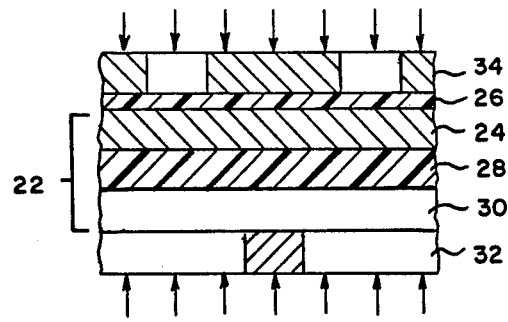
FIGS. 2–11 show the steps involved in making an electronic component in accordance with one embodiment of the present invention.
Figure 5:
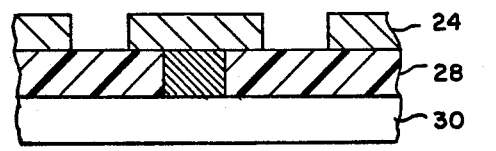
Figure 6:
Figure 7:
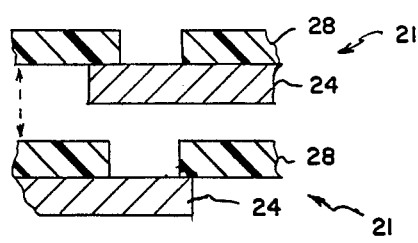

In FIGS. 2–6, there are shown the steps involved in making an element in the form of a laminate 21 (FIG. 6). As shown in FIG. 2, a multi-layer blank 22 is used as a starting material; blank 22 comprises an electrically-conductive layer which is a copper layer 24, a layer 26 of positive resist adhered to one side of layer 24, and a layer 28 of negative resist adhered to an opposite side of layer 24. A removable cover sheet 30 is placed over layer 28. Layer 24 can be any electrically-conductive metal; however, a preferred metal is copper. Positive resist layer 26 can be, for example, Kodak 809 positive resist, available from Eastman Kodak Co., Rochester, N.Y. The negative resist layer 28 can be a photopolymerizable plastic as disclosed, for example, in commonly-assigned U.S. Pat. No. 4,322,490, granted Mar. 30, 1982, and this patent is expressly incorporated herein by reference. Cover sheet 30 can be formed, for example, from polyethylene terephthalate, obtainable from Eastman Kodak Co. under the trademark "Estar."

A blank 22 of a type which can be used in the present invention is shown in U.S. Pat. No. 4,342,151, granted Aug. 3, 1982. Suitable thicknesses for the various layers in blank 22 are 0.002-0.005 inches for layer 26, 0.0007-0.006 inches for layer 24, 0.0005-0.005 inches for layer 28, and about 0.001 inches for sheet 30.

In a first step (FIG. 2), layer 28 is exposed with ultraviolet light through a mask 32, and the layer 26 is simultaneously exposed with ultraviolet light through a mask 34. The ultraviolet light can be provided by mercury vapor lamps.

Figure 3:
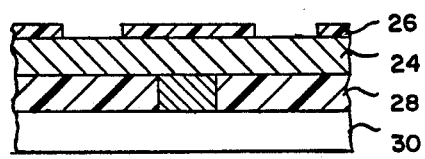
Figure 4:
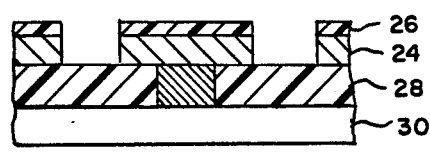

In the next step, as shown in FIG. 3, the positive resist layer 26 is developed using, for example, Kodak 809 developer in a 50% solution at about 30° C. The copper layer 24 is then etched (FIG. 4) to form a desired conductor pattern in layer 24. The copper layer 24 is etched using a solution of 2 M $CuCl_2.2 H_2O$ and 2M HCl, the solution having a pH of approximately minus 1.

After the etching of the copper layer 24, the resist layer 26 is stripped off, using a 5% solution of sodium hydroxide (pH of approximately 13.6), leaving the combination shown in FIG. 5. The cover sheet 30 is then removed, and the negative resist layer 28 is developed in a 1, 1, 1-trichloroethane solution to produce a laminate 21 (FIG. 26).

Figure 8:
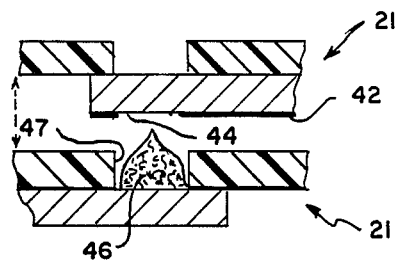
Figure 9:
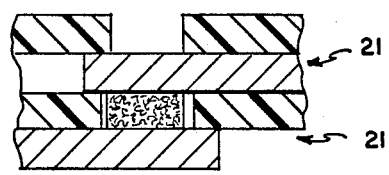
Figure 10:
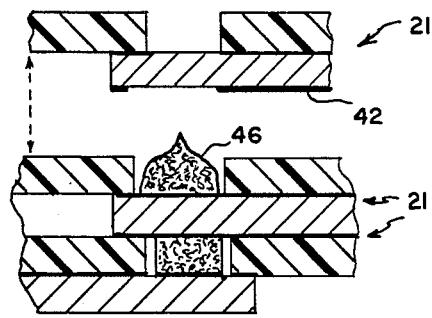
Figure 11:
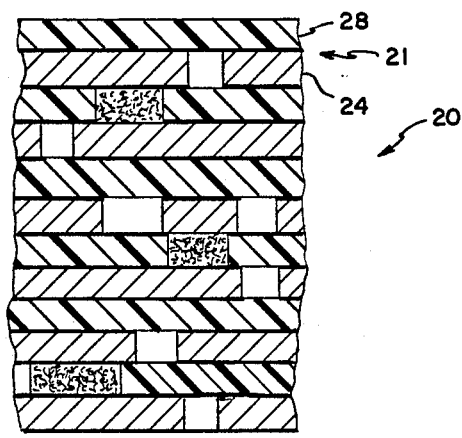

As shown in FIGS. 7-11, laminates 21 are assembled together to form a component having a plurality of copper layers 24. With reference to FIG. 8, a dielectric adhesive 42 is screen printed on a copper layer 24 of a laminate 21 in a pattern such that selected areas 44 of the conductive copper material are exposed. On a second laminate 21, a conductive paste 46 is applied to copper layer 24 through openings 47 in layer 28. The conductive paste 46 is a pliable material which can be screen printed onto the layer 24; however a preferred method is to dispense the paste into openings 47. Laminates 21 are then joined, as shown in FIG. 9. These steps are repeated (FIG. 10) to form a component having the desired number of laminates 21, as for example motor coil 20 having six laminates 21, as shown in FIGS. 1 and 11. When the component has been fully formed, it is cured for 10-60 minutes at a temperature of between about 150° C. and about 200° C. During the curing step, the laminates 21 of coil 20 are pressed together with a light pressure of 2-5 psi.

When the invention disclosed herein is used to form motor coil 20, each laminate 21 comprises a plastic layer 28 and a copper layer 24 which is formed into a plurality of coil elements 25 (FIG. 1). When the two laminates 21 are joined together (the step shown in FIG. 9), the coil elements 25 in one laminate 21 are superposed over the coil elements 25 in the other laminate 21, and the coil elements 25 are connected in series by means of the connections made by the conductive paste 46. In a like manner, two more pairs of laminates 21 can be joined, and the three pairs of laminates 21 can be combined to form coil 20 (FIG. 11) in which each pair of laminates 21 is electrically isolated from the other pairs.

The dielectric adhesive 42 can be, for example, Cermalloy CL84-5133 dielectric adhesive available from Heraeus-Cermalloy, West Conshohocken, Pa. The conductive paste 46 can be a thermoplastic containing conductive particles or an epoxy plastic containing conductive particles. The conductive particles can be, for example, silver or copper particles. A preferred conductive paste is Marpoxy 98-240 paste which contains copper particles and is obtainable from Key Polymer Company. Other suitable conductive pastes are a conductive epoxy obtainable from Heraeus-Cermalloy under the tradename Cermalloy CL20-5328, and Amicon C9901 obtainable from the Amicon Company. An important consideration in selecting the dielectric adhesive 42 and the conductive paste 46 is that they not contain solvents which would react with the other materials in laminate 21.

Figure 12:
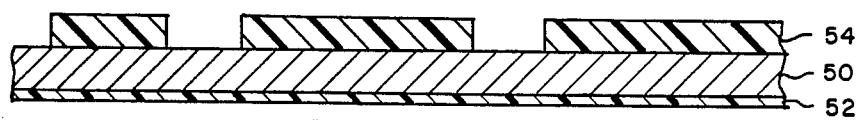
FIGS. 12–17 show a method of making an electronic component in accordance with second and third embodiments of the present invention.
Figure 13:
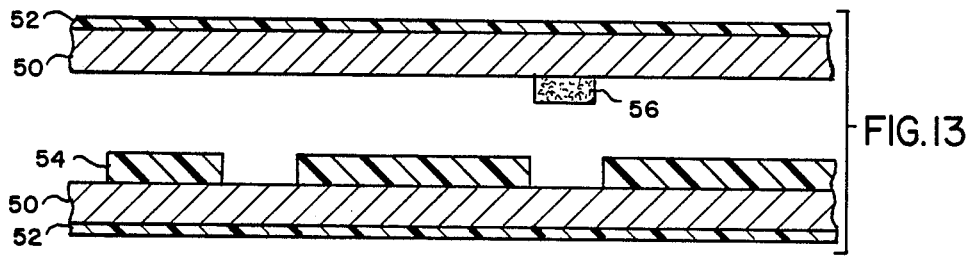
Figure 14:
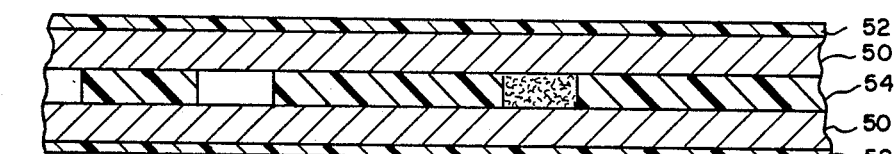
Figure 15:
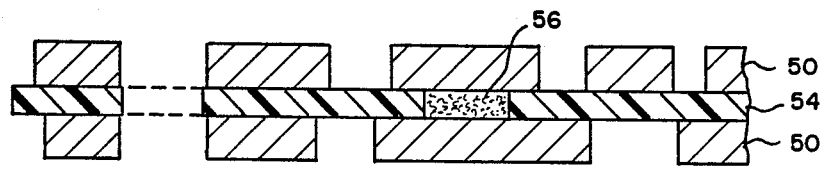

With reference to FIGS. 12-17, there are shown alternate embodiments of Applicants' invention. In FIG. 12, there is shown a copper sheet 50 having a resist layer 52 on one side and a plastic layer 54 which has been screen printed in a desired pattern on an opposite side thereof. Plastic for layer 54 can be a thermoplastic, such as amorphous polyesters or polycarbonates, in a solvent suitable for screen printing. One example of suitable plastics are polyesters from three-dimensional bis-phenols. In FIG. 13 there is shown, along with the arrangement shown in FIG. 12, a second sheet 50 of conductive material having a conductive paste 56 screen printed on one side and a resist layer 52 formed on the other side. The two sheets 50 are joined together (FIG. 14), and steps are taken to cause the plastic layer 54 and paste 56 to cure, crosslink, or thermally set; the conductive paste 56 forms an electrical connection between the two copper sheets 50. The arrangement shown in FIG. 14 can then be exposed and etched to form a desired pattern, e.g., as shown in FIG. 15. It is also possible to screen print layer 54 on a sheet 50, partially cure layer 54, add resist layer 52, and then form the laminate shown in FIG. 14.

Figure 16:
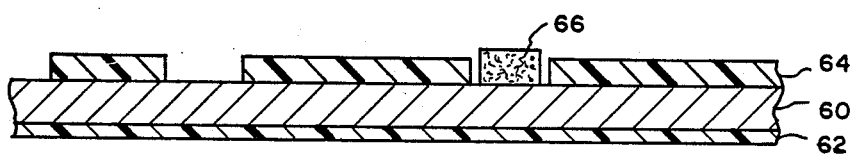
Figure 17:
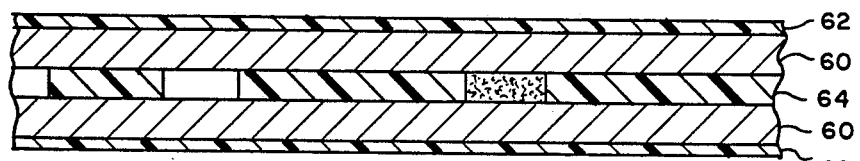

In FIGS. 16 and 17, another embodiment of the present invention is shown in which the plastic or polymer 64 is printed on a copper sheet 60 having a resit layer 62. The plastic 60 is then partially cured, and a conductive paste 66 is screen printed on the copper sheet 60 (FIG. 16). A second copper sheet 60 can then be laminated to the first (FIG. 17), with little or no concern for registration, and the plastic 60 can be completely cured.

The invention has been described in detail with particular reference to certain embodiments thereof, but it will be understood that variations and modifications can be effected within the spirit and scope of the invention.

We claim:

1. A method of making an electronic component, said method comprising the steps of:

forming a first laminate having a conductive material adhered to a dielectric substrate, said substrate having openings therein which extend to said conductive material;

forming a second laminate having a conductive material adhered to a dielectric substrate, said substrate of said second laminate having openings which extend to the conductive material of said second laminate;

applying a pliable conductive paste to the conductive material of one of said laminates through the openings in the substrate thereof, said paste being applied in a quantity sufficient to extend out of the openings; and superposing said laminates such that said paste is confined in said openings and is shaped by said laminates to form a solid, electrical connection having low electrical resistance between the conductive material in said laminates.

2. A method, as defined in claim 1, wherein a dielectric adhesive is applied to one of said laminates prior to said superposing step.

3. A method, as defined in claim 2, wherein the substrate in said first and second laminates is a formed from a photopolymerizable plastic.

4. A method, as defined in claim 3, wherein the conductive material in each of said laminates is copper which has been etched to form it into a desired pattern.

5. A method, as defined in claim 1, wherein said substrate is screen printed onto said conductive material.

6. A method according to claim 1, wherein said conductive material is copper, and said paste is an epoxy paste having conductive particles therein.

7. A method according to claim 6, wherein said epoxy paste is Marpoxy 98-240 paste.

8. A method according to claim 6, wherein said epoxy paste is Cermalloy CL20-5328 paste.

9. A method according to claim 6, wherein said epoxy paste is Amicon C990 paste.

10. A method of making a motor coil, said method comprising the steps of:

forming first and second laminates each of which comprises a plastic layer and an electrically-conductive layer formed into a plurality of coil elements each plastic layer having openings therein which extend to said electrically-conductive layer;

applying a pliable conductive paste to the electrically-conductive layer of one of said laminates through the openings in the plastic layer thereof, said paste being applied in a quantity sufficient to extend out of the openings; and joining said laminates such that the coil elements of one of said laminates are superposed over the coil elements in the other laminate and said conductive paste is shaped as said laminates are joined to form a solid, electrical connection having low electrical resistance between the coil elements in said first and second laminates.

* * * * *